United States Patent [19]

Takahashi et al.

[11] Patent Number: 4,643,629

[45] Date of Patent: Feb. 17, 1987

[54] AUTOMATIC LOADER

[75] Inventors: Nobuyuki Takahashi; Ryuji Sugimoto; Yasuyuki Shirai, all of Tokyo, Japan

[73] Assignee: Anelva Corporation, Tokyo, Japan

[21] Appl. No.: 790,288

[22] Filed: Oct. 22, 1985

[30] Foreign Application Priority Data

Oct. 30, 1984 [JP] Japan ................. 59-226658

[51] Int. Cl.$^4$ ............................. B65G 1/06
[52] U.S. Cl. ................. 414/331; 198/346.2; 198/347; 414/222; 414/416
[58] Field of Search .......... 414/222, 331, 416, 403; 198/346.2, 347

[56] References Cited

U.S. PATENT DOCUMENTS

| | | | |
|---|---|---|---|
| 3,902,615 | 9/1975 | Levy et al. ............... | 414/416 X |
| 4,178,113 | 12/1979 | Beaver et al. ............ | 414/416 X |
| 4,336,438 | 6/1982 | Uehara .................... | 414/222 X |
| 4,405,435 | 9/1983 | Tateishi et al. ........... | 204/298 |
| 4,547,247 | 10/1985 | Warenback et al. ...... | 204/298 X |

FOREIGN PATENT DOCUMENTS

57-19219  2/1982  Japan ..................... 414/331

Primary Examiner—Leslie J. Paperner
Attorney, Agent, or Firm—Townsend & Townsend

[57] ABSTRACT

In an automatic loader for automatically loading a flat unprocessed substrate to a substrate processing apparatus for processing the flat substrate and automatically unloading a processed substrate, the automatic loader has: a plurality of cassette stages for vertically moving cassettes having a plurality of substrates held horizontally and parallel to each other; a first substrate convey mechanism contacting a single door of the substrate processing apparatus and forming a common conveyance path of all substrates; a single substrate posture control stage arranged in contact with the first convey mechanism to correct a posture of the substrate to be fed in the substrate processing apparatus; second substrate convey mechanisms for forming at least one conveyance path between the plurality of cassette stages and the substrate posture control stage and exchanging and conveying the substrate; and substrate counters arranged in the respective conveyance paths of the second substrate convey mechanisms. The processed substrates are returned to the original cassette.

6 Claims, 18 Drawing Figures

AUTOMATIC LOADER

BACKGROUND OF THE INVENTION

The present invention relates to an automatic loader in a substrate processing apparatus such as a sputtering apparatus for sequentially receiving substrates or wafers from a cassette and processing the substrates, wherein the loader automatically loads and unloads each substrate with respect to the substrate processing apparatus.

Loading/unloading of wafers with respect to a sputtering apparatus in the semiconductor IC fabrication process is performed in accordance with a cassette-to-cassette system. According to this system, a cassette loaded with wafers is inserted in a vacuum apparatus, wafers are removed from the cassette and subjected to wafer processing such as film deposition in the vacuum apparatus, and the wafers are recovered in the cassette.

In such an automatic loader, however, an operator must insert the cassette in the vacuum apparatus and remove it after film deposition is completed. High-speed automation in the IC fabrication process cannot therefore be achieved.

In several other conventional systems, a cassette is placed in an outer atmosphere outside a vacuum chamber and is fed into the vacuum atmosphere. U.S. Pat. No. 4405435 describes a "continuous sputtering apparatus" having an external housing means for holding cassettes near different inlet and outlet ports. In this structure, a cassette for supplying unprocessed wafers is different from a cassette for receiving processed wafers. Only a single cassette can be placed at each of the inlet and outlet ports. Japanese Patent Disclosure No. 57-63677 describes a "continuous vacuum processing apparatus" having a means for changing two auxiliary wafer holders placed near inlet and outlet ports. The main feature of the invention lies in that the auxiliary wafer holders are standard accessories. A cassette used in another fabrication process is not used as an auxiliary wafer holder. This conventional technique provides an automatic loader having at least two cassettes exposed in the outer atmosphere. However, in such an automatic loader, a cassette for holding unprocessed wafers is different from a cassette for holding processed wafers, and the two cassettes are separated from each other. In order to automate the semiconductor IC fabrication process in a clean room, demand has arisen for an automatic loader for unloading processed wafers into the same cassette from which unprocessed wafers were supplied, without a need to move the cassette.

SUMMARY OF THE INVENTION

It is a principal object of the present invention to provide an automatic loader for loading unprocessed wafers from a stationary cassette into a substrate processing apparatus and unloading processed wafers into the same stationary cassette from the apparatus.

In order to achieve the above object of the present invention, there is provided an automatic loader for automatically loading unprocessed substrates to a substrate processing apparatus for processing flat substrates and automatically unloading the substrates processed by the substrate processing apparatus, comprising: a plurality of cassette stages for moving vertically upward or downward a cassette which holds a plurality of horizontal substrates parallel to each other, the plurality of cassette stages being rotated about a substantially vertical axis; a first substrate convey mechanism having a common conveyance path for conveying all the substrates to the substrate processing apparatus through a single door thereof or conveying all the substrates from the substrate processing apparatus therethrough; a single substrate posture control stage, arranged to be substantially in contact with the first substrate convey mechanism at the opposite side of the substrate processing apparatus, for controlling within a predetermined range a posture of the substrate to be fed in the substrate processing apparatus along a feed direction; a plurality of second substrate convey mechanisms, having at least one conveyance path between the plurality of cassette stages and the substrate posture control stage, for exchanging the substrate with each of the cassette stages and the substrate posture control stage and conveying the substrate; and a substrate counter, arranged on each conveyance path of the first and second substrate convey mechanisms, for counting the number of substrates fed in the substrate processing apparatus or returned therefrom.

DETAILED DESCRIPTION OF THE PREFERRED EMBODIMENTS

Preferred Embodiments of the present invention will be described with reference to the accompanying drawings.

Figure 1:
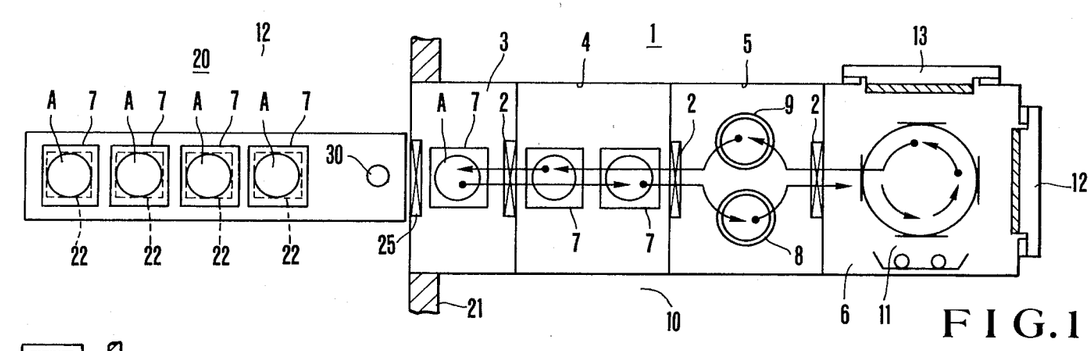
FIG. 1 is a schematic diagram showing an automatic loader according to an embodiment of the present invention.

FIG. 1 shows the schematic system configuration of an automatic loader applied to a sputtering apparatus according to an embodiment of the present invention. The structure of the sputtering apparatus and wafer feeding and processing will be first described. Referring to FIG. 1, reference numeral 1 denotes a sputtering apparatus arranged in a maintenance room 10. The sputtering apparatus 1 has four vacuum chambers, i.e., a load lock chamber 3, a buffer chamber 4, a cleaning chamber 5 and a sputtering chamber 6 which can be independently evacuated through corresponding gate valves 2. When the gate valves 2 are opened, wafers A can be conveyed from one chamber to other by a belt conveyor mechanism (not shown). The unprocessed wafers A horizontally held in a cassette 7 in the load lock chamber 3 are sequentially conveyed one by one and wafers after film deposition are collected to the same cassette 7. In an etching stage 8 in the cleaning chamber 5 while the wafers are being conveyed, sputter cleaning is performed by ion bombardment prior to film deposition. In a cooling stage 9, the processed wafers are cooled. Wafer heating immediately prior to film deposition is performed in a heating stage 11 in the sputtering chamber 6. Sputter atoms are emitted from magnetron cathodes 12 and 13 to form films on the wafers.

Reference numeral 20 denotes an automatic loader as the main feature of the present invention. The automatic loader 20 is arranged in the clean room 12 to oppose the load lock chamber 3 and has four cassette stages 22. Cassettes 7 each holding a plurality of unprocessed wafers A are respectively placed on the cassette stages 22. The maintenance room 10 is separated by a partition wall 21 from the clean room 12. A door 25 such as a gate valve or the like is provided on the wall of the load lock chamber 3 which opposes the automatic loader 20.

The wafer A starting from one cassette 7 in the automatic loader 20 is fed in the cassette 7 in the load lock chamber 3 through a substrate posture control stage 30. In the sputtering apparatus 1, as described above, the wafer A is processed through the conveyance path as indicated by the arrow. The processed wafer is conveyed into the automatic loader 20 again through the door 25 of the load lock chamber 3 and is held in one of the cassettes 7 in the automatic loader 20.

In the arrangement of FIG. 1, the centers of the four cassettes 7 on the automatic loader 20 and those of the three cassettes 7 in the sputtering apparatus 1 are substantially linearly aligned. In this case, one of the ends of the automatic loader 20 is considerably separated from the partition wall 21, so that another wall of the clean room 12 must be at a fairly long distant position, thereby increasing a floor area of the clean room 12.

Figure 2:
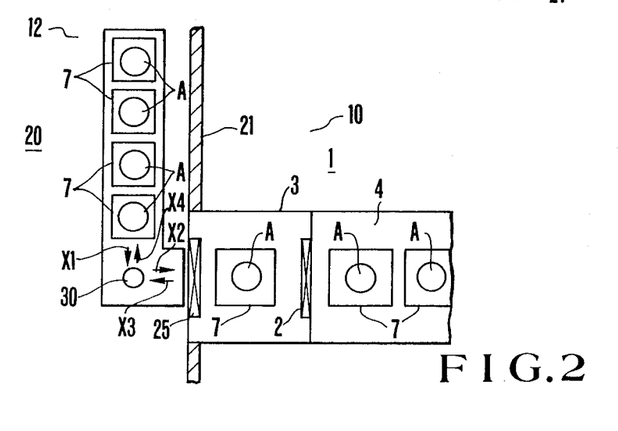
FIGS. 2 and 3 are schematic diagrams showing automatic loaders according to other embodiments of the present invention, respectively.

The automatic loader 20 is preferably arranged along the partition wall 21, and an embodiment therefor is illustrated in FIG. 2. In such a layout, a wafer A starting from each cassette 7 in the automatic loader 20 is conveyed parallel to the partition wall 21, as indicated by the arrow X1. The direction of conveyance is rotated through about 90° at the substrate posture control stage 30, so that the wafer A is conveyed along a direction indicated by an arrow X2. The wafer A is thus fed in the sputtering apparatus 1 through the door 25 of the load lock chamber 3. The wafer A processed in the apparatus 1 is fed back to the automatic loader 20 in a direction indicated by an arrow X3 through the door 25 of the load lock chamber 3. The direction of conveyance is rotated through about 90° at the substrate posture control stage 30, so that the wafer A is conveyed in a direction indicated by an arrow X4 and is held in the corresponding cassette 7. As compared with the embodiment of FIG. 1, the partition wall 21 can come close to the wall of the clean room 12 which opposes the wall 21. Therefore, the floor area of the clean room 12 can be decreased.

Figure 3:
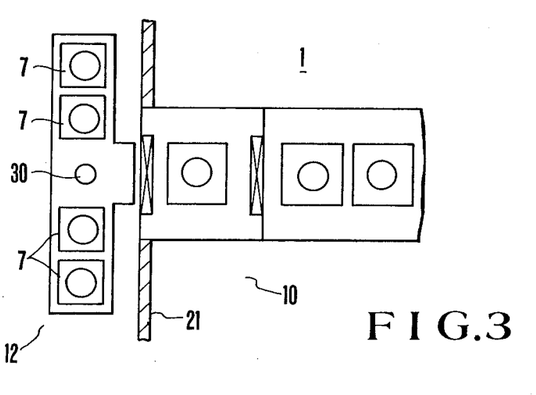

FIG. 3 shows another embodiment showing still another layout for a combination of the automatic loader 20 and the sputtering apparatus 1. The line connecting the centers of the four cassettes 7 on the automatic loader 20 is parallel to the partition wall 21 in the same manner as in FIG. 2. However, two cassettes 7 at one side are symmetrical with two cassettes 7 at the other side about the substrate posture control stage 30. The automatic loader 20 as a whole comes closer to the sputtering apparatus 1. The distance between the farthest cassette 7 and the substrate posture control stage 30 can be shortened. The time for conveyance of the wafer A between the sputtering apparatus 1 and the automatic loader 20 can be shortened, thereby improving productivity.

The structure of the automatic loader 20 of FIG. 3, its wafer feeding and wafer returning operation will be described in more detail.

Figures 4A, 4B:
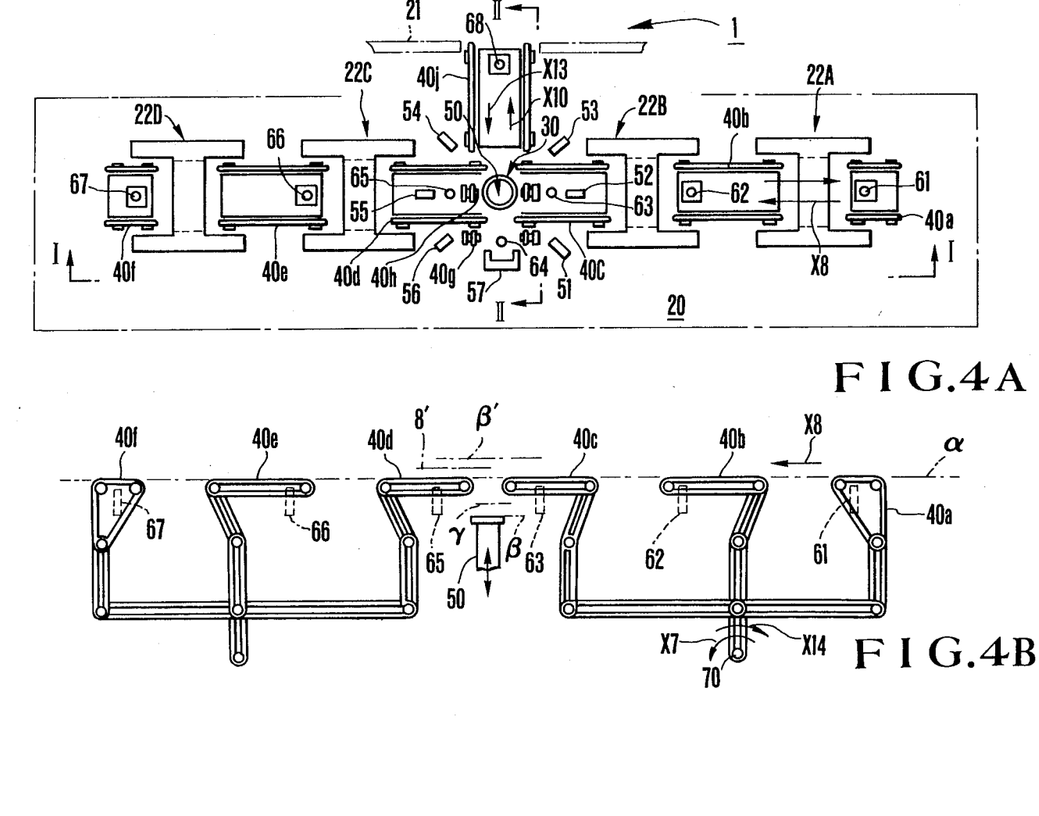
FIG. 4A is a plan view of the automatic loader shown in FIG. 3.
FIGS. 4B and 4C are sectional views of a substrate convey mechanism taken along the lines I—I and II—II of FIG. 4A, respectively.
Figure 4C:
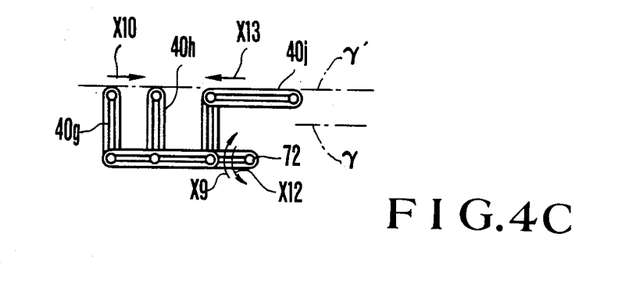

FIG. 4A is a plan view of the automatic loader 20, and FIGS. 4B and 4C are sectional views of the substrate convey mechanism taken along the lines I—I and II—II of FIG. 4A. Referring to FIGS. 4A to 4C, cassette stages 22A and 22B are symmetrical with cassette stages 22C and 22D about the substrate posture control stage 30. Belt conveyor mechanisms 40a to 40f are arranged between the cassette stages 22A to 22D and the stage 30. The belt conveyor mechanisms 40a to 40f are arranged substantially parallel to the partition wall 21 and are interlocked with each other. Belt conveyor mechanisms 40g, 40h and 40j are arranged between the substrate posture control stage 30 and the sputtering apparatus 1. The belt conveyor mechanisms 40g to 40j are interlocked to horizontally convey the wafers. The two belts 40g and 40h are substantially vertically arranged, as shown in FIG. 4C, and the belt 40j is horizontal but perpendicular to the partition wall 21.

The substrate posture control stage 30 has a wafer rotary table 50 at a central portion thereof. Wafer stoppers 51 to 56 and an orientation flat sensor 57 are arranged around the wafer rotary table 50. Eight proximity switches 61 to 68 are arranged at positions which do not contact with the wafer surfaces along the wafer conveyance path.

Referring to FIGS. 4A, 4B and 4C, an outer frame for covering the entire internal structure of the automatic loader 20, control panels, the cassettes and wafers are omitted.

Figure 5A:
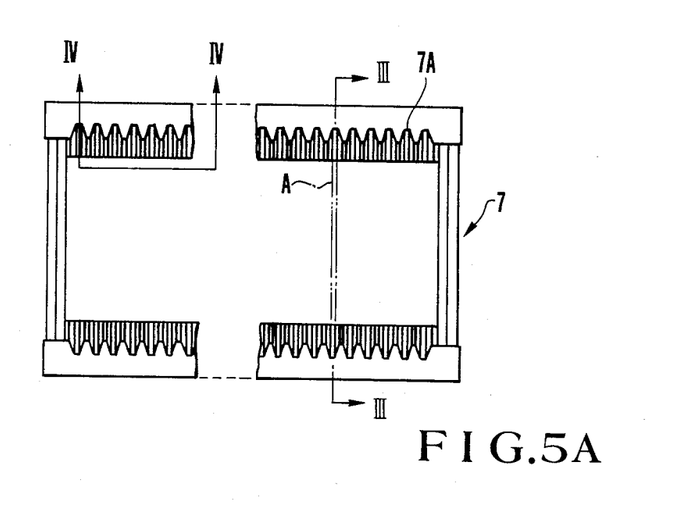
FIG. 5A is a plan view of a cassette.
Figures 5B, 5C:
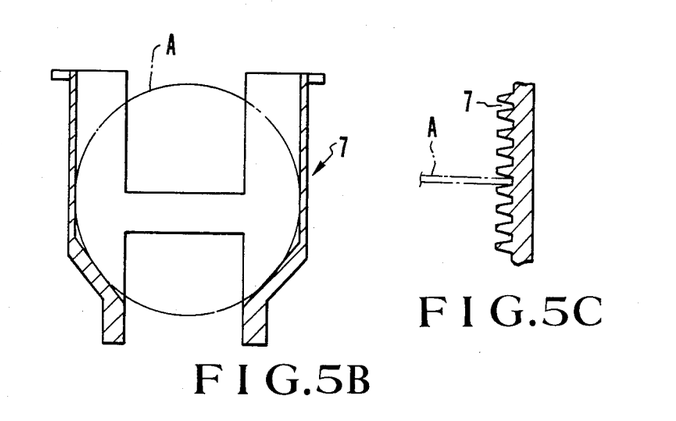
FIGS. 5B and 5C are sectional views of the cassette taken along the lines III—III and IV—IV of FIG. 5A, respectively.

FIG. 5A is a plan view of the cassette 7 placed on each of the cassette stages 22A to 22D, and FIGS. 5B and 5C are respectively sectional views of the cassette 7 taken along the lines III—III and IV—IV of FIG. 5A. The cassette 7 has a plastic box with two open side surfaces. A plurality of grooves 7A are formed on the inner walls along the right-and-left direction at predetermined intervals. A silicon wafer A having a diameter of 150 mm and a thickness of 0.6 mm is inserted in each groove 7A. The shape of the wafer A and the dimensions of the cassette 7 are standardized by specifications of the Semiconductor Equipment and Materials Institute (SEMI), and a detailed description thereof will be omitted.

The operation of the belt conveyor mechanisms 40a to 40j will be described with reference to FIGS. 4A, 4B and 4C.

The horizontal conveyance of the wafer starting from the cassette placed on the cassette stage 22A to the sputtering apparatus 1 by means of the belt conveyor mechanisms 40a and 40b in the stage 22A will be described in detail. Transfer operation of the wafer to the belt conveyor mechanisms 40a and 40b will be described later with reference to FIGS. 6A to 6E, and a detailed description thereof is not made here. When the wafer is placed on the belt conveyor mechanisms 40a and 40b, a drive pulley 70 is rotated by a motor (not shown) about its axis in a direction indicated by an arrow X7. The wafer is conveyed along a direction indicated by an arrow X8 while the vertical position of the wafer is kept at a height α. The wafer is brought into sequential contact with the belt conveyor mechanisms 40b, 40c and 40d and is conveyed above the substrate posture control stage 30. The wafer abuts against and stopped by the wafer stoppers 54, 55 and 56 (to be described in detail later with reference to FIGS. 7A to 7D). In this case, the proximity switch 65 detects the wafer and supplies a detection signal to the controller. The pulley 70 and the belt conveyors are stopped. Subsequently, the wafer rotary table 50 is lifted by a mechanism (to be described in detail with reference to FIGS. 7A to 7D) from the β position to the α position. The wafer is placed on the wafer rotary table 50 and is attracted and held by the upper surface thereof. The rotary table 50 together with the wafer is vertically lifted to a height β' and is at the same time rotated. The wafer posture relative to the sputtering apparatus 1 is held in the predetermined range upon detection of the orientation flat sensor 57. Thereafter, the belt conveyor mechanisms 40g to 40j are lifted together with their drive system by the mechanism (to be described later with reference to FIGS. 7A to 7D) from the γ position to the γ' position. The wafer rotary table 50 stops attracting the wafer and is moved downward to the height β, while the wafer is placed on the belt conveyor mechanisms 40g to 40j located at the height γ'. When a drive pulley 72 for the belt conveyor mechanisms 40g to 40j is rotated by a motor (not shown) in a direction indicated by an arrow X9 about the axis of the pulley 72, the wafer is horizontally conveyed in a direction indicated by an arrow X10 and passes by the proximity switch 68, so that the wafer is fed by the automatic loader 20 to the sputtering apparatus 1. A wafer detection signal from the proximity switch 68 is used as a signal for counting the number of wafers fed by the automatic loader 20. After the wafer is loaded, the belt conveyor mechanisms 40g to 40j are stopped, and these conveyor mechanisms together with their drive mechanism are moved downward to the height γ. The above operation is repeated to sequentially feed the wafers from the cassette in the cassette stage 22A in the automatic loader 20 to the sputtering apparatus 1.

It is readily understood that the same operation as for the wafers supplied from the cassette stage 22A can be performed in the cassette stages 22B to 22D. The wafer fed from the cassette stages 22A and 22B is handled by the wafer stoppers 54, 55 and 56 and the proximity switch 64, while the wafer from the cassette stages 22C and 22D is handled by the wafer stoppers 51, 52 and 53 and the proximity switch 63. The belt conveyor mechanisms 40a, 40b and 40c horizontally convey the wafer from the cassette stages 22A and 22B, while the belt conveyor mechanisms 40d, 40e and 40f horizontally convey the wafer from the cassette stages 22C and 22D.

The processed wafer returned from the sputtering apparatus 1 is collected by the automatic loader 20 in the same cassette stage 22A in the following manner. The belt conveyor mechanisms 40g, 40h and 40j are moved to the height γ' as described above to receive the processed wafer returned from the sputtering apparatus 1. When the drive pulley 72 is rotated by the motor in a direction indicated by an arrow X12, the wafer is conveyed in a direction indicated by an arrow X13. When the wafer reaches above the substrate posture control stage 30, the wafer abuts against the two wafer stoppers 51 and 56 and is stopped. The proximity switch 64 detects that the wafer has reached the substrate posture control stage 30 and generates a detection signal which stops the belt conveyor mechanisms 40g, 40h and 40j. Subsequently, the wafer is moved downward to the position γ. As a result, the wafer placed on the belt conveyor mechanisms 40g, 40h and 40j is transferred to the belt conveyor mechanisms 40c and 40d. When the drive pulley 70 is rotated in a direction indicated by the arrow X14, the wafer is sequentially conveyed to the belt conveyor mechanisms 40d, 40c, 40b and 40a and reaches the cassette stage 22A. The wafer is thus held in the cassette on the cassette stage 22A. The above operation is repeated to sequentially collect the processed wafers in the cassette. It should be noted that the proximity switch 68 counts the number of wafers returned from the sputtering apparatus 1 to the automatic loader 20. Processed wafer collection for the cassette stages except for the cassette stage 22A can be readily understood.

Figures 6A, 6B:
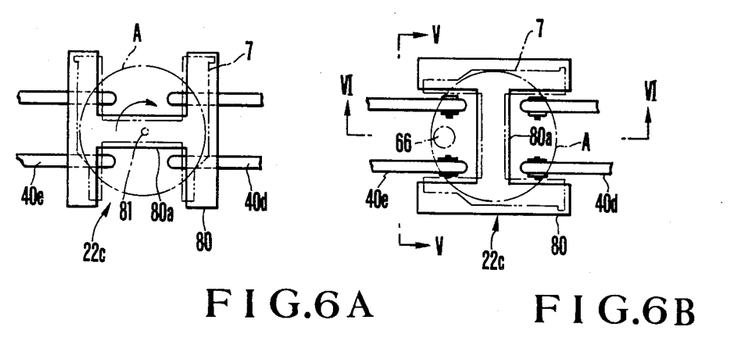
FIGS. 6A and 6B are respectively plan views showing a cassette receiving state and a 90°-rotated state of a cassette stage.
Figures 6C, 6D:
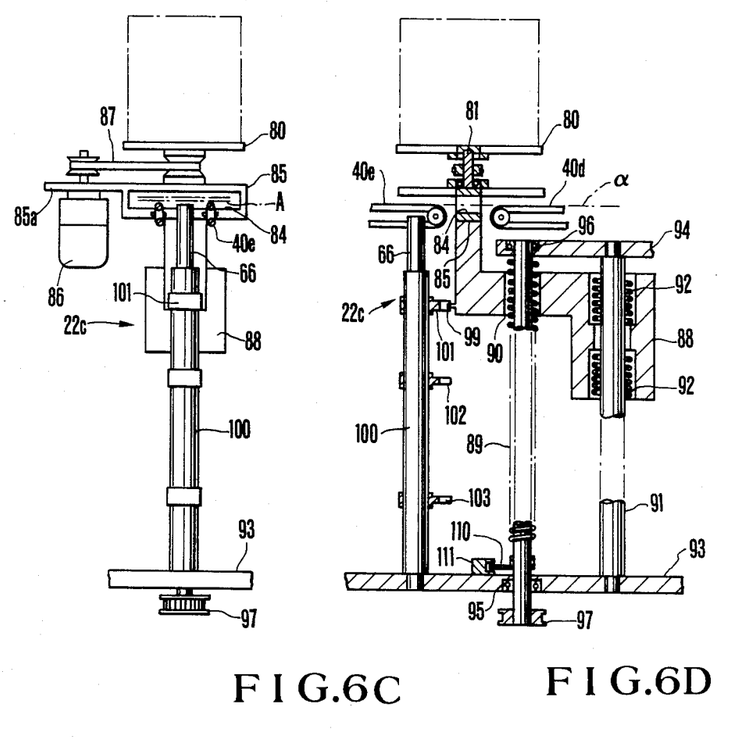
FIG. 6C is a sectional view of the cassette stage taken along the line V—V of FIG. 6B.
FIGS. 6D and 6E are respectively sectional views taken along the line VI—VI of FIG. 6B wherein the cassette is located in the upper position and is being moved downward.
Figure 6E:
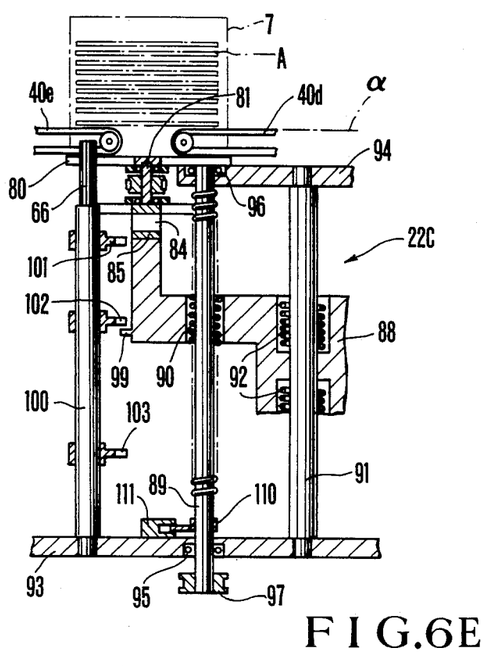

The structure of the cassette stage will be described in detail with reference to FIGS. 6A to 6E. FIG. 6A is a plan view of the cassette stage 22C of FIG. 4A, FIG. 6B is a plan view showing a state wherein the cassette stage 22C is rotated through about 90°, FIG. 6C is a sectional view of the cassette stage 22C taken along the line V—V of FIG. 6B, FIG. 6D is a sectional view of the cassette stage 22C taken along the line VI—VI of FIG. 6B, and FIG. 6E is a sectional view of the cassette stage 22C taken along the line VI—VI of FIG. 6B so as to explain a state wherein the cassette stage is being moved downward.

The cassette stage 22C has a rotatable H-shaped cassette table 80 located at the highest position. The cassette 7 having wafers A located horizontally and parallel to each other is placed on the cassette table 80. The cassette table 80 can be vertically moved (to be described later), but is normally held in a state of FIG. 6A, i.e., a state wherein a connecting portion 80a stops at an angular position substantially parallel to the belt conveyor mechanisms 40d and 40e. When the cassette 7 is placed on the cassette table 80, the table 80 is rotated by a mechanism (to be described later) through about 90° about a rotating shaft 81, so that the table 80 is held in the state of FIG. 6B wherein the cassette table 80 can be moved upward while the cassette 7 is placed thereon. When the states of FIGS. 6A and 6B are compared with each other, the state of FIG. 6A does not allow downward movement of the cassette table 80 since the moving path crosses the belt conveyor mechanisms 40d and 40e, while the state of FIG. 6B allows downward movement of the cassette table 80 since the downward path is secured. In this state, the proximity switch 66 can detect the presence/absence of wafers A held in the cassette 7.

The cassette table 80 has a rectangular frame, is rotatable through the rotating shaft 81, and is supported on a tunnel member 85 with a substrate tunnel 84 through which the wafer A can pass. A rotational force of a stepping motor 86 mounted on an extended portion 85a (FIG. 6C) of the tunnel member 85 is transmitted through a belt 87, so that the cassette table 80 can be rotated through a predetermined angle. The cassette table 80 is normally located at the highest position. In this state, the substantially central portion of the substrate tunnel 84 is at the same height α as the belt conveyor mechanisms 40d and 40e, as shown in FIG. 6D. Therefore, even if the wafer placed on the cassette stage 22D is horizontally conveyed, the wafer passes through the substrate tunnel 84, and the cassette stage 22C does not interfere the movement of the wafer.

The tunnel member 85 is fixed on a vertically movable support 88. The support 88 has a nut 90 threadably engaged with a ball screw 89, and two slide bearings 92 for supporting a guide shaft 91. The ball screw 89 is rotatably mounted between a cassette stage bottom plate 93 and a support plate 94 through radial bearings 95 and 96. The guide shaft 91 is fixed between the cassette stage bottom plate 93 and the support plate 94 without being through the bearings. A rotational force from a motor (not shown) is transmitted to the ball screw 89 through a pulley 97 via a belt. The ball screw 89 is then rotated to vertically move the support 88 along the guide shaft 91. The uppermost position of the cassette table 80 is detected such that a photoelectric switch in an upper limit position sensor 101 mounted on a column 100 is turned off by a pin 99 extending from the support 88. In order to transfer the wafer A from the cassette 7 for holding unprocessed wafers to the belt conveyor mechanisms 40d and 40e, the ball screw 89 is rotated until the pin 99 turns off a photoelectric switch in a reference position sensor 102. In other words, the cassette table 80 is moved downward. Thereafter, the cassette table 80 is moved downward by a stepping motor at a predetermined pitch. The lowermost wafer A is transferred from the cassette 7 to the belt conveyor mechanisms 40d and 40e and is detected and counted by the proximity switch 66. This state is shown in FIG. 6E. The lowermost wafer A is fed out from the cassette stage 22C upon energization of the belt conveyor mechanisms 40d and 40e, and then the cassette table 80 is moved downward by the stepping motor by a predetermined number of pitches, thereby transferring the wafer A onto the belt conveyor mechanisms 40d and 40e. This operation is repeated to feed out all the unprocessed wafers A from the cassette 7, and the cassette stage 22C reaches the lowermost position. The pin 99 then turns off the photoelectric switch in a lower limit position sensor 103, thereby indicating the current position of the cassette stage 22C. Thereafter, the cassette table 80 having the empty cassette 7 thereon is moved upward to the uppermost position. In this case, the ball screw 89 is rotated by the stepping motor under high-precision control. When a pin 110 and a sensor 111 which cooperate to count the rotational speed of the ball screw 89 are arranged at the lower portion of the screw 89, reliability of vertical movement of the cassette stage 22C can be greatly improved.

The above operation is concerned with the transfer operation of the unprocessed wafers A from the cassette stage 22C to the belt conveyor mechanisms 40d and 40e. Similarly, the transfer operation of the processed wafers from the belt conveyor mechanisms 40d and 40e to the cassette can be performed by moving the cassette table 80 from the lowermost position at the predetermined pitch.

Figure 7A:
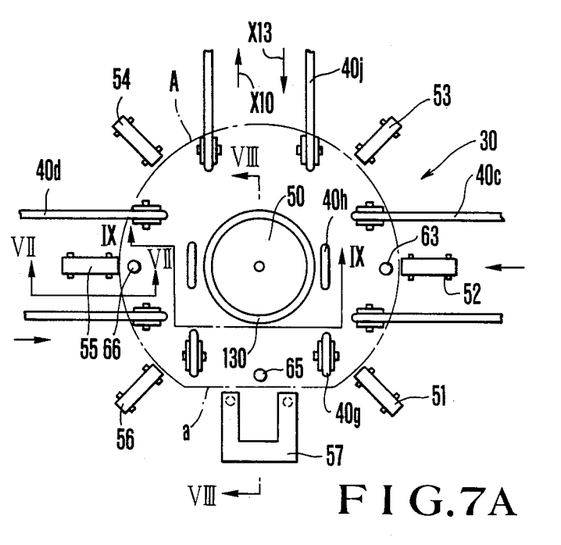
FIG. 7A is a plan view of a substrate posture control stage.
Figures 7B, 7C:
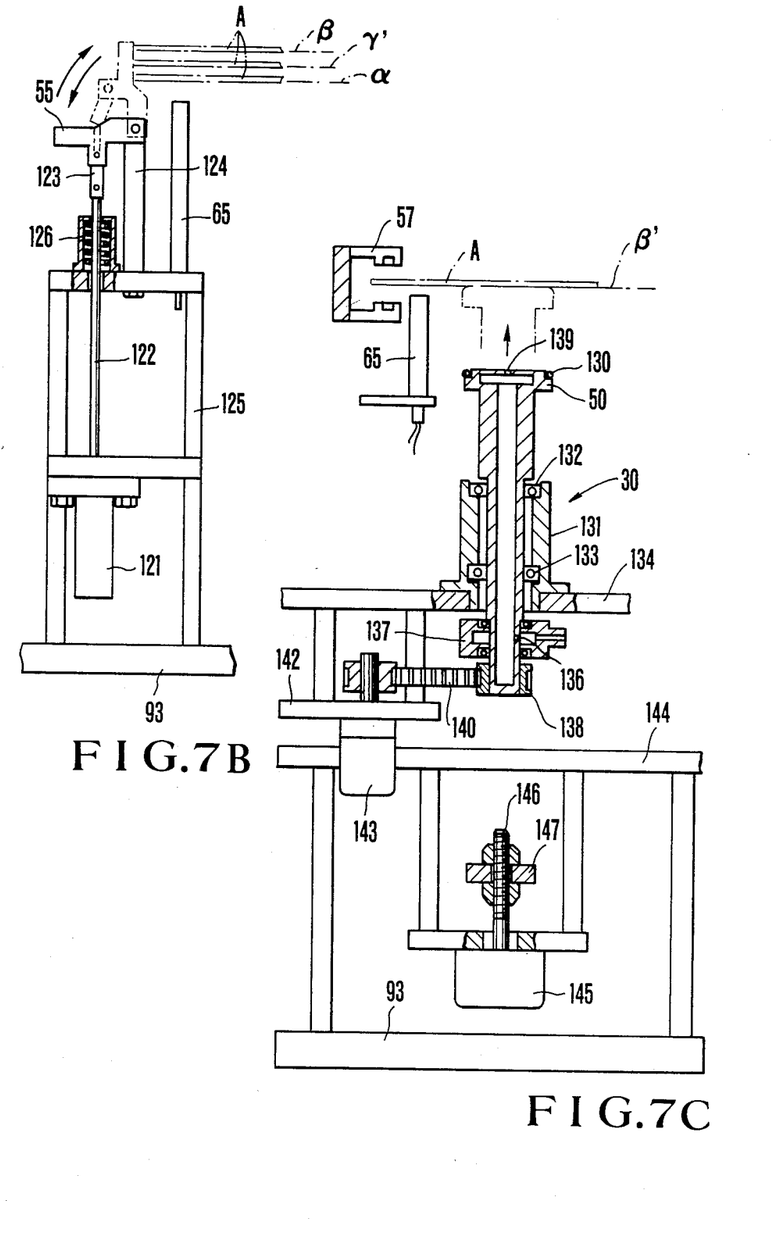
FIGS. 7B, 7C and 7D are sectional views of the substrate posture control stage taken along the lines VII—VII, VIII—VIII and IX—XI of FIG. 7A, respectively.
Figure 7D:
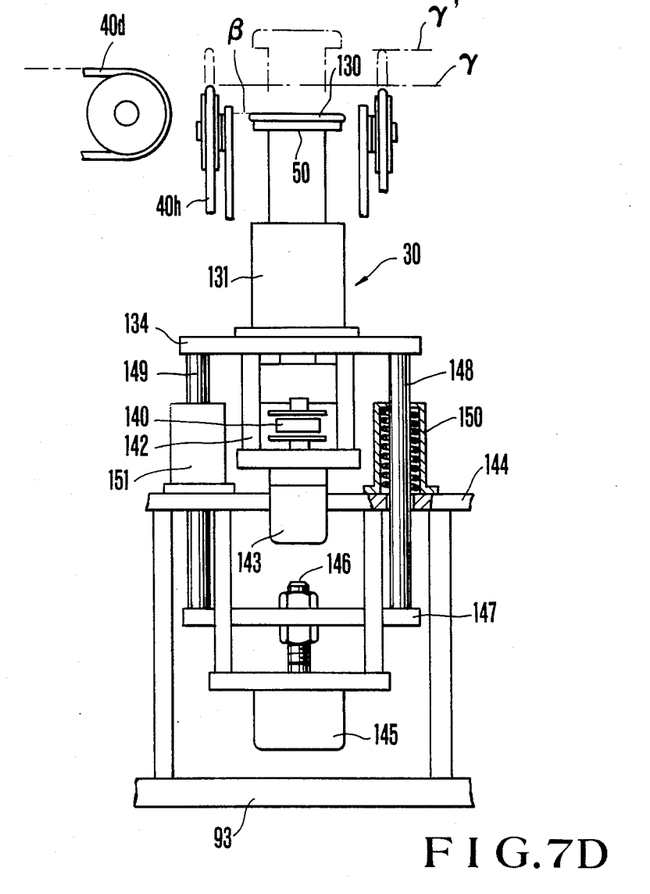

The structure and operation of the substrate posture control stage 30 will be described in detail with reference to FIGS. 7A to 7D. FIG. 7A is a plan view of the substrate posture control stage 30 and FIGS. 7B to 7D are respectively sectional views of the stage 30 taken along the lines VII'VII, VIII—VIII and IX—IX of FIG. 7A. As described above, the wafer A fed above the substrate posture control stage 30 while placed on the belt conveyor mechanism 40c abuts against three wafer stoppers 54, 55 and 56. Subsequently, the wafer A falls within the range defined by the wafer stoppers 51 to 56, so that the center of the wafer A is substantially aligned with the center of the rotary table 50. The rotary table 50 attracts the wafer A by a mechanism (to be described later) and can be rotated through its axis. An orientation flat corresponding to the notch a of the wafer A is detected by the orientation flat sensor 57 consisting of two photoelectric switches and is aligned in a direction perpendicular to a wafer feed direction (indicated by an arrow X13). Therefore, the position of the wafer relative to the sputtering apparatus can be held constant.

As shown in FIG. 7B, one end of the wafer stopper 55 (the same as in other wafer stoppers) is pivotally coupled to the upper end of a shaft 122 of an air cylinder 121 through a connecting rod 123, and the other end of the wafer stopper 55 is pivotally coupled to the upper end of a column 124. The wafer stopper 55 is horizontally held in the normal state, as indicated by the solid line. The air cylinder 121 and the column 124 are mounted on a stopper support 125 on the automatic loader bottom plate 93. The shaft 122 slidably extends through a slide bearing 126. When the shaft 122 is moved upward upon operation of the air cylinder 121, the wafer stopper 55 is pivoted through about 90° about the connecting portion with the column 124, thereby defining the periphery position of the wafer A together with other wafer stoppers. The wafer stopper 55 stops the wafers located at the heights α, γ' and β'. When the air cylinder 121 is contracted, the wafer stopper 55 is laid down and is located at a position lower than the position α, so that the wafer stopper 55 does not interfere the conveyance of the wafer A. As described above, when the rotary table 50 having the wafer A thereon is rotated, the wafer stopper 55 is laid down.

The wafer stoppers 51 to 54 and 56 have the same structure as that of the wafer stopper 55. These wafer stoppers can be vertically moved separately or together.

The rotary table 50 has a cylindrical member mounted with a rubber ring 130 at the upper edge thereof, as shown in FIGS. 7C and 7D. The rotary table 50 is rotatably supported by a bearing pipe 131 through two bearings 132 and 133. The bearing pipe 121 is fixed on a rotary table support plate 134. The wafer A can be placed on the rubber ring 130. An exhaust hole 136 is formed in the wall of the lower portion of the rotary table 50. An exhaust adapter 137 is mounted in the exhaust hole 136. A rotation drive pulley 138 is mounted below the adapter 137. The exhaust adapter 137 is connected to a vacuum pump (not shown), and the rotary table 50 is rotatable with respect to the adapter 137. A small hole 139 is formed at the center of the upper surface of the rotary table 50. When the interior of the rotary table 50 is evacuated by the vacuum pump, the wafer A placed on the rotary table 50 is attracted to the rubber ring 130.

The rotation drive pulley 138 receives through a belt 140 a driving force from a motor 143 mounted on the lower surface of the support plate 134 through a drive assembly 142, thereby rotating the rotary table 50. A base 144 is mounted below the rotary table 50, and an air cylinder 145 is mounted at the lower portion of the base 144. A lifting base 147 is fixed on the shaft 146 of the air cylinder 145. The support plate 134 is fixed by a pair of shafts 148 and 149 on the lifting base 147. Vertical elongation/contraction of the shaft 146 of the air cylinder 145 is converted into vertical movement of a pair of shafts 148 and 149, thereby vertically moving the rotary table 50. A pair of slide bearings 150 and 151 are fixed on the upper surface of the base 144 to guide the pair of shafts 148 and 149.

In the states of FIGS. 6C and 6D, the shaft 146 of the air cylinder 145 is held in the most contracted state, i.e., at the height $\beta$. In this case, horizontal conveyance of the wafer A located at the position $\alpha$ and placed on the belt conveyor mechanisms 40d and 40e is not interfered by the rotary table 50. After the center of the wafer A is substantially aligned with the axis of the rotary table 50 by the behavior of the wafer stoppers 51 to 56, the air cylinder 145 is driven to elongate the shaft 146 to the maximum length. The rotary table 50 is then moved upward to the position $\beta'$, while the table 50 receives the wafer A from the belt conveyor mechanisms 40c and 40d. Thereafter, the internal pressure of the rotary table 50 is decreased by a vacuum pump (not shown), and air is drawn through the small hole 139, so that the wafer A is attracted to the rotary table 50 while the lower surface of the wafer A is in contact with the rubber ring 130. The rotary table 50 is rotated by the motor 143 while the wafer is kept attracted by the rotary table 50. In this case, when the wafer A does not shield the optical path of the photoelectric switch arranged in the orientation flat sensor 57, the orientation flat corresponding to the notch a of the wafer A is located at a region corresponding to the optical path, thereby stopping rotation of the rotary table 50. The belt conveyor mechanisms 40g, 40h and 40j are moved upward from the position $\gamma$ of FIG. 7D to the position $\gamma'$. An attracted state of the wafer A is cancelled, and at the same time, the rotary table 50 is moved downward from the position $\beta'$ to the position $\beta$. As a result, the wafer A placed on the rotary table 50 is transferred to the belt conveyor mechanisms 40g, 40h and 40j which are moved upward. Therefore, the wafer A can be fed from the automatic loader 20 to the sputtering apparatus 1.

The above description is concerned with loading of the wafer A from the automatic loader 20 by means of the substrate posture control stage 30. Unloading of the wafer A from the sputtering apparatus 1 to the automatic loader 20 can be readily understood from the above description.

The substrate posture control stage 30 serves to locate the unprocessed wafer A to be fed from the automatic loader 20 to the sputtering apparatus 1 within the predetermined range so as to effectively perform wafer processing. When the stage 30 is not provided, asymmetrical wafers can be fed with various postures in the sputtering apparatus 1, and it is difficult to uniformly hold the wafers with high precision. Furthermore, since the upper surface of the rotary table 50 is in contact with the lower surface of the wafer A, a sensor may be arranged at the contact position, thereby checking the processing state of each wafer A. For example, when an aluminum film is formed on the wafer A by the sputtering apparatus 1, an eddy current type probe coil can be arranged at the contact position to measure a thickness of the aluminum film deposited on the wafer in a nondestructive manner.

The functions (FIG. 4A) of the proximity switches 61 to 68 which are mentioned a few times in the previous description will be summarized hereinafter.

The proximity switch 61 checks whether or not the wafer is held in a predetermined position in the cassette upon vertical movement of the cassette on the cassette stage 22A. The proximity switch 61 also counts the number of unprocessed wafers to be conveyed from the cassette or the number of processed wafers to be held in the same cassette. The proximity switches 62, 66, 67 are arranged in the cassette stages 22B, 22C and 22D to perform the above-mentioned functions.

The proximity switch 65 detects that the wafer fed from the cassette stage 22A or 22B along the direction indicated by the arrow X8 abuts against the wafer stoppers 54, 55 and 56 and reaches the substrate posture control stage 30. At the same time, the proximity switch 65 counts the number of wafers reaching the substrate posture control stage 30. Similarly, the proximity switch 63 detects the unprocessed wafers fed from the cassette states 22C and 22D and counts the number of wafers reaching the substrate posture control stage 30. The proximity switch 68 detects and counts the number of unprocessed wafers loaded from the automatic loader 20 or the number of processed wafers unloaded from the sputtering apparatus 1. The proximity switch 64 detects and counts the number of processed wafers returned to the substrate posture control stage 30.

By combining the counting functions of the respective proximity switches, the operator can detect whether or not the unprocessed wafers are loaded by the automatic loader 20 through a given cassette along the predetermined belt conveyor path, or whether or not a failure occurs to disable feeding of the wafer. When a failure does not occur in the sputtering apparatus, a plurality of processed wafers can be returned to the cassette from which nonprocessed wafers were supplied.

The present invention is exemplified by a sputter deposition apparatus as the substrate processing apparatus. However, the present invention can be applied to a deposition apparatus, a plasma-assisted CVD (Chemical Vapor Deposition), a dry etching apparatus or the like. The substrate is exemplified by a silicon wafer used in the semiconductor IC fabrication process. However, the shape, dimensions and material of the substrate are not limited. Furthermore, the number of cassette stages 22 constituting the automatic loader 20 is not limited to four, but can be increased/decreased. The lifting mechanism of the cassette stage 22 is not limited to the arrangement exemplified in the embodiment described above, but can be modified in a variety of applications. In the above embodiment, the capacitive proximity switches are used, and the orientation flat sensor 57 comprises a photoelectric switch. However other conventional detecting means may be used.

As may be apparent from the above description, in the automatic loader of the present invention, the substrates held in the cassette are fed in the substrate processing apparatus, and the processed substrates are returned to the same cassette. Since the path formed between the substrate processing apparatus and the substrate posture control stage is common for feeding and returning the substrate, the conveyance distance of the substrate can be shortened, and the overall system arrangement can be made compact. A large number of substrates having the identical shape can be automatically loaded/unloaded at high efficiency with high precision.

What is claimed is:

1. An automatic loader for automatically loading unprocessed substrates to a substrate processing apparatus for processing flat substrates and automatically unloading the substrates processed by said substrate processing apparatus, comprising:
   a plurality of cassette stages for moving vertically upward or downward a cassette which holds a plurality of horizontal substrates parallel to each other, the plurality of cassette stages being rotated about a substantially vertical axis;
   a first substrate convey mechanism having a common conveyance path for conveying all the substrates to said substrate processing apparatus through a single door thereof or conveying all the substrates from said substrate processing apparatus therethrough;
   a single substrate posture control stage, arranged to be substantially in contact with one end of said first substrate convey mechanism opposite to said substrate processing apparatus, for controlling within a predetermined range a posture of the substrate to be fed in said substrate processing apparatus along a feed direction;
   a plurality of second substrate convey mechanisms, having at least one conveyance path between said plurality of cassette stages and said substrate posture control stage, for exchanging the substrate with each of said cassette stages and said substrate posture control stage and conveying the substrate; and
   a substrate counter, arranged on each conveyance path of said first and second substrate convey mechanisms, for counting the number of substrates fed in said substrate processing apparatus or returned therefrom.

2. A loader according to claim 1, wherein said first and second substrate convey mechanisms comprise belt conveyors, respectively.

3. A loader according to claim 1, wherein said first substrate convey mechanism has a plurality of vertical belt conveyors arranged to interpose said substrate posture control stage therebetween.

4. A loader according to claim 1, wherein said plurality of cassette stages have substrate tunnels, respectively, so that when said second substrate convey mechanisms convey the substrates from the cassette placed on one cassette stage, other cassette stages are located at highest positions to pass said substrates through said substrate tunnels.

5. A loader according to claim 1, wherein said plurality of cassette stages have a substantially vertical rotating shaft for rotating the cassette through a predetermined angle at a highest position.

6. A loader according to claim 1, wherein said substrate posture control stage has a sensor for monitoring a processing state of the substrate when the substrate is returned from said substrate processing apparatus to the cassette.

* * * * *